US006561844B1

United States Patent
Johnson

(10) Patent No.: US 6,561,844 B1
(45) Date of Patent: May 13, 2003

(54) LUG FOR PROVIDING BOTH ELECTRICAL AND MECHANICAL CONNECTION BETWEEN BUSES AND WATT HOUR METER SOCKETS

(75) Inventor: Jeffrey L. Johnson, Lincoln, IL (US)

(73) Assignee: Eaton Corporation, Cleveland, OH (US)

( * ) Notice: Subject to any disclaimer, the term of this patent is extended or adjusted under 35 U.S.C. 154(b) by 0 days.

(21) Appl. No.: 10/011,114

(22) Filed: Nov. 13, 2001

(51) Int. Cl.7 .............................................. H01R 33/945
(52) U.S. Cl. ...................... 439/507; 439/801; 439/790; 439/146; 439/167; 361/659; 361/668; 361/670
(58) Field of Search .................................. 439/517, 146, 439/167, 801, 790, 791, 793; 361/659, 668, 670

(56) References Cited

U.S. PATENT DOCUMENTS

| | | | | |
|---|---|---|---|---|
| 3,551,876 A | * | 12/1970 | Walter | 439/656 |
| 4,057,312 A | * | 11/1977 | Hagermo | 439/801 |
| 4,117,530 A | * | 9/1978 | Reed et al. | 439/517 |
| 4,532,574 A | | 7/1985 | Reiner et al. | |
| 4,629,281 A | * | 12/1986 | Kruger | 439/791 |
| 5,951,324 A | | 9/1999 | Campbell et al. | |
| 5,980,311 A | | 11/1999 | Campbell et al. | |
| 5,982,611 A | | 11/1999 | Campbell et al. | |
| 6,012,937 A | | 1/2000 | Campbell et al. | |
| 6,099,344 A | * | 8/2000 | Chadbourne | 439/791 |

* cited by examiner

Primary Examiner—P. Austin Bradley
Assistant Examiner—Briggitte Hammond
(74) Attorney, Agent, or Firm—Martin J. Moran

(57) ABSTRACT

An electrically conductive lug for use with a meter socket for a watt-hour meter, which permits the meter to have integral line and load buses. The lug provides an electrical connection between the meter socket and each wire, and it provides mechanical support for the wire. Because the lug serves as both a supporting and a conducting device, the invention eliminates the need for separate wire connectors, bussing, molded insulative bus supports and/or additional connecting lugs. Therefore, the numerous parts previously susceptible to damage or failure under normal operation loads, were eliminated, making construction of the meter assembly more efficient.

7 Claims, 6 Drawing Sheets

LUG FOR PROVIDING BOTH ELECTRICAL AND MECHANICAL CONNECTION BETWEEN BUSES AND WATT HOUR METER SOCKETS

BACKGROUND OF THE INVENTION

1. Field of the Invention

The present invention relates to meter centers for electrical power distribution systems. Specifically, it relates to improvements to the meter socket assembly to include a lug for providing electrical and mechanical connection between the buses and meter socket.

2. Background Information

In the electric utility industry, plug-in, socket-type watt-hour meters are commonly used to measure electric power consumption at residential or commercial sites. A socket housing, known as a meter center, is typically mounted between the electrical power supply and the load. Meter centers may include one or more meter compartments, each of which contains a pair of line and load terminals, which are respectively connected to electric line and load conductors.

Each meter compartment has a meter socket to which a load and a supply bus are connected. The load bus connects the meter compartment to the location wherein the power is utilized. The supply bus extends from the feeder bus, which in turn extends from the utility power lines. The meter socket secures the meter, providing an electrical connection between the supply buses and the load buses. This electrical connection is formed by single-ended, fastenerless plug-in jaws on the meter socket, dimensioned and configured to engage corresponding stabs on the meter.

Currently available watt-hour meter sockets contain many bus connecting and supporting components, which complicate the assembly process and are susceptible to damage or failure under normal operation loads.

Accordingly, an improved meter socket assembly that eliminates unnecessary components and provides a more durable and reliable meter socket assembly, is desired.

SUMMARY OF THE INVENTION

The present invention is directed to a lug for use within a meter socket assembly. Four lugs are connected to the meter socket base, one to each fastenerless meter jaw. Each lug derives mechanical support from the meter socket plate and is an electrical conductor, connecting to one jaw on the meter socket and the corresponding wire.

A typical socket for an electrical meter includes two supply buses, and two load buses, although the present invention is not limited to this number of corresponding supply and load buses. An electrical connection follows the path from the utility lines, through the feeder bus, the supply bus, the meter, the load bus and finally to the consumer. The electrical connection from the supply bus, through the meter, and to the load bus is formed by double-sided fastenerless plug-in jaws on the meter socket, with each plug-in jaw corresponding to one bus, and a stab on the meter corresponding to each jaw. To connect each bus to the corresponding plug-in jaw in the situation wherein a round wire instead of a flat busbar is utilized, prior art required separate bus connectors within an electrically insulative molded support to hold the bus and meter socket assembly together while providing the necessary electrical connection.

The present lug invention is constructed of an electrically conductive material such as aluminum and includes a vertical stab which engages with the fastenerless jaws located on the under side of the meter socket. A fastener, such as a self-threading screw, keeps the lug engaged with the socket. The conductive lug also includes a wire opening with a clamping means. This wire opening slides over and engages with one of the supply or wires. The wire opening clamping means, such as a setscrew, is tightened around the wire, securing the connection. Once connected, the electrically conductive lug provides the necessary current path to the meter, without the use of additional bussing and/or supports. Furthermore, the fastener coupling the lug to the meter socket provides sufficient support to eliminate the previously required molded insulative supports, necessary to support the supply wires and meter socket assembly.

It is therefore an aspect of the present invention to provide a watt-hour meter with integral line and load buses.

It is another aspect of the present invention to provide mechanical support for the wires within a meter socket assembly and to provide an electrical path between the wire and the plug-in jaw on the meter socket, while minimizing the number of components necessary.

It is a further aspect of the present invention to decrease the construction cost and complexity of a meter socket assembly while increasing its durability, by minimizing the number of necessary components.

These and other aspects of the invention will become apparent through the following description and drawings.

DETAILED DESCRIPTION

The present invention is directed to an improved meter socket plate supported lug for providing mechanical support and electrical connection for wires leading to electrical meter sockets.

Figure 1:
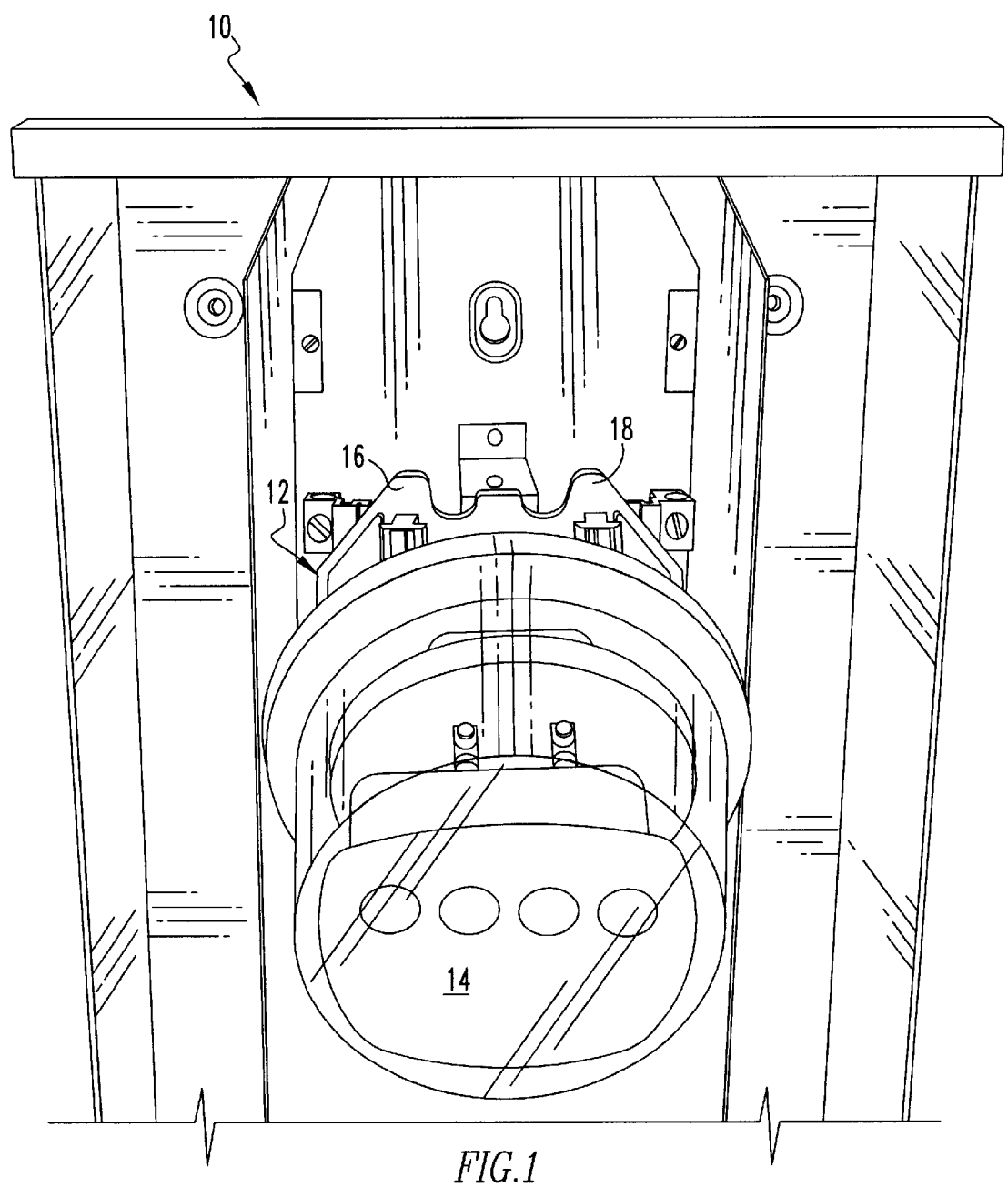
FIG. 1 is a isometric view of a meter for which the present invention will be used.
Figure 2:
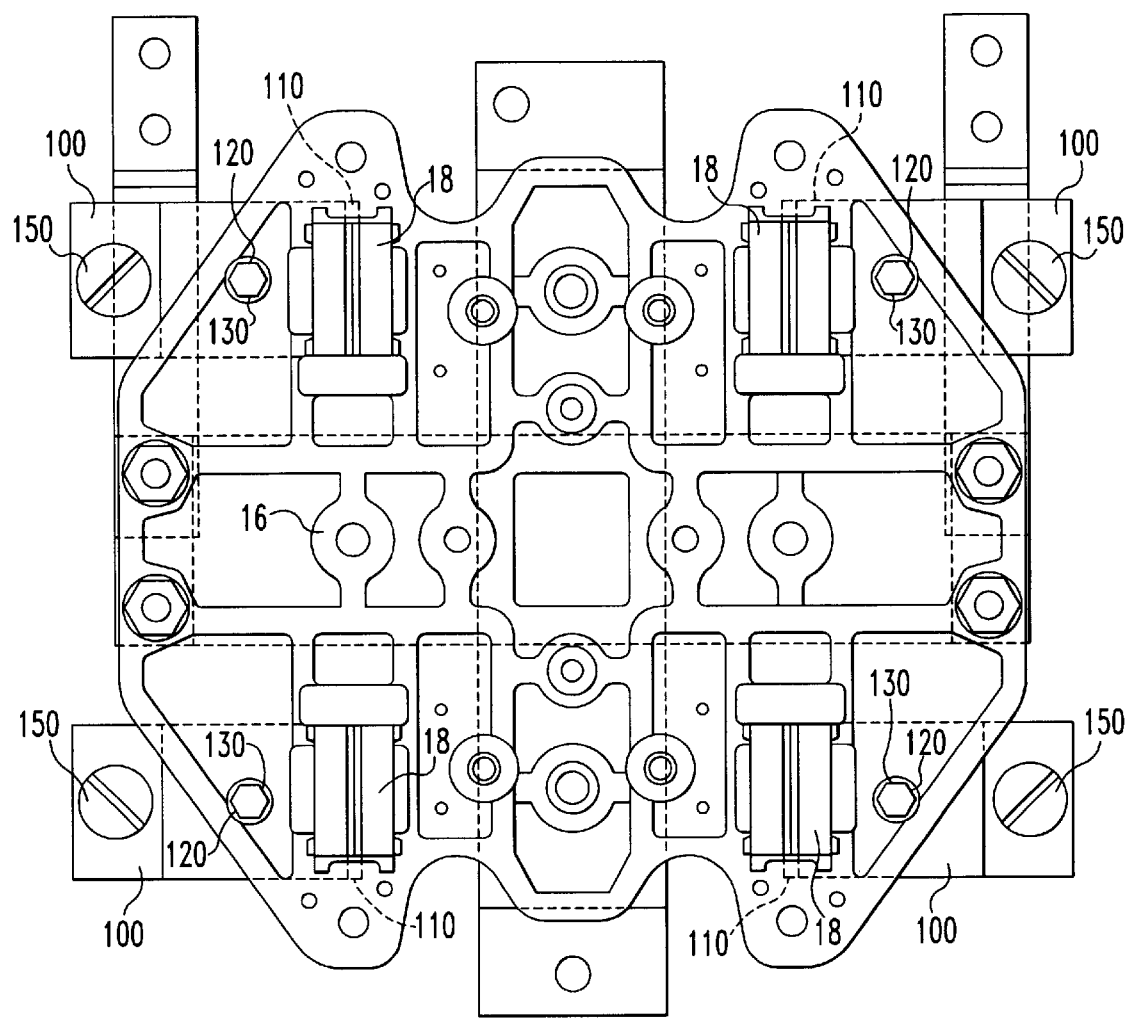
FIG. 2 is a front view of a meter socket for a watt-hour meter, illustrating the location of the present lug invention.
Figure 3:
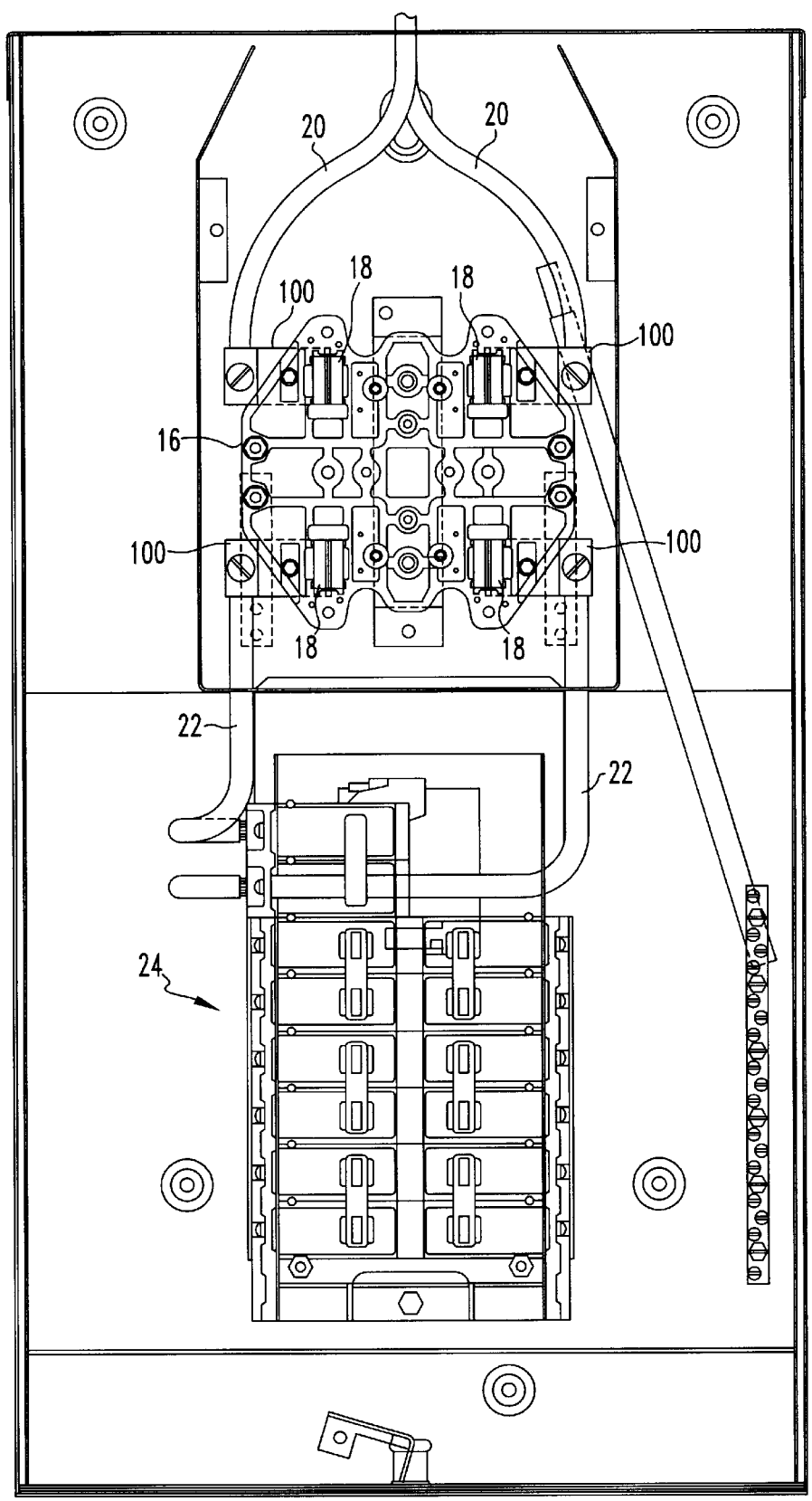
FIG. 3 is a front view of a meter socket for a watt hour meter, and the circuit breaker panel associated with the meter, illustrating the location of the present lug invention.

A typical electrical meter with which the present invention will be used is illustrated in FIGS. 1–3. The meter cabinet 10 includes a meter socket 12, for electrical connection with a meter 14. The meter socket 12 includes a socket plate 16, having a plurality of double-ended fastenerless meter jaws 18, dimensioned and configured to receive corresponding prongs on the back face of the meter 14 (not shown, and well known). The meter cabinet 10 also includes a pair of supply wires 20, and a pair of load wires 22, which in this case lead from the metered socket 12 to the circuit breaker panel 24, protecting the ultimate load for the current. The path of the current is therefore from the supply wires 20, through the first set of double-ended fastenerless meter jaws 18, through the meter 14, through the second pair of double-ended fastenerless meter jaws 18, to the load wires 22, through the circuit breaker 24, and ultimately to the load.

The double-ended fastenerless meter jaws 18 include substantially identical, electrically connected spring-biased jaws on the front and back surfaces of the socket plate 16. These jaws are dimensioned and configured to secure a flat surface between them, for example, the prongs on the rear surface of the meter 14, or the angled busbars commonly used within some meter centers. However, in this application, the supply wires 20 and load wires 22 are round wires. The present invention is directed towards forming the electrical and mechanical connection between the wires 20, 22, and the double-ended fastenerless meter jaws 18. The present invention replaces a prior art apparatus wherein the buses were partially encased in and supported by electrically insulative molded supports, and a separate electrically conductive lug was used to connect the wires 20, 22 to the meter jaws 18.

The lug 100 of the present invention, shown in FIG. 3, accomplishes both; mechanical support and electrical connectivity for the wires 20, 22. The lug 100 is electrically conductive, being constructed of aluminum in the preferred embodiment. However, it will be appreciate by the skilled artisan that any number of electrically conductive materials could be used.

Figure 4:
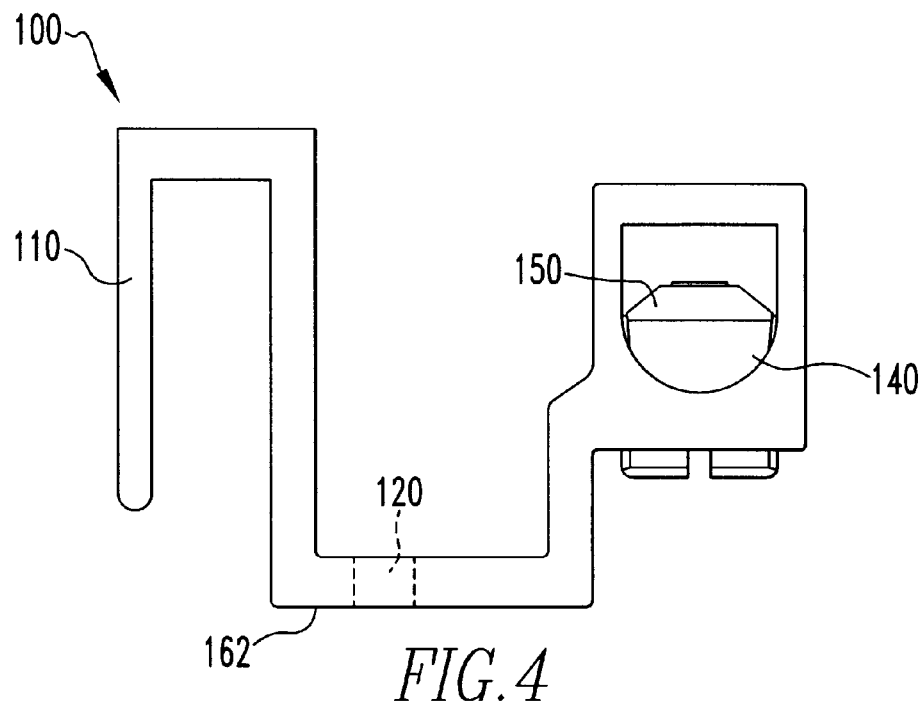
FIG. 4 is a top view of the lug of the present invention.

As shown in FIG. 4, the lug 100, in the preferred embodiment, has a vertical stab 110. This vertical stab 110 engages with the double-ended fastenerless jaw 18 corresponding to the meter 12 supply stab engaged to the other end of the jaw 18 on the opposite side of the socket assembly 12. The lug 100 also has a pilot hole 120 for threading of fastener 130 to further secure the lug 100 to the meter socket 12. To provide the electrical connection with the supply bus, the lug 100 has an engaging wire opening 140 with a fastening means 150. The supply wire (not shown) passes through the wire opening 140 and is fastened in place using the fastening means. The edge 162 fits against surface 164 to prevent rotation of the lug.

Figure 5:
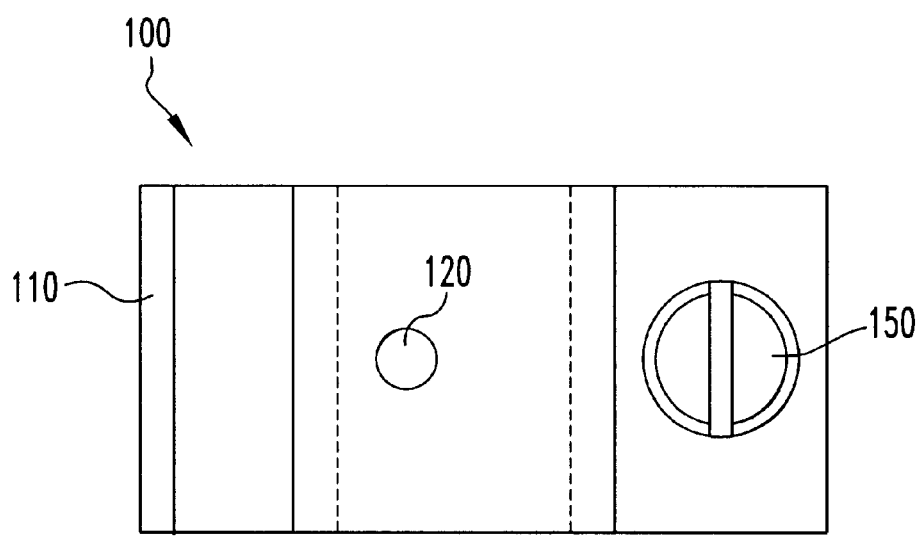
FIG. 5 is a front view of a lug according to the present invention.

In the preferred embodiment, the lug 100 is aluminum. As illustrated in FIG. 5, the fastener 130 is a screw passing through hole 160 in the meter socket and hole 120 and threading into the lug. The fastening means 150 on the engaging loop 140 is a setscrew. However, it will be appreciated by those skilled in the art that any number of commonly used fasteners could be used as alternatives to those utilized in the preferred embodiment.

Figure 6:
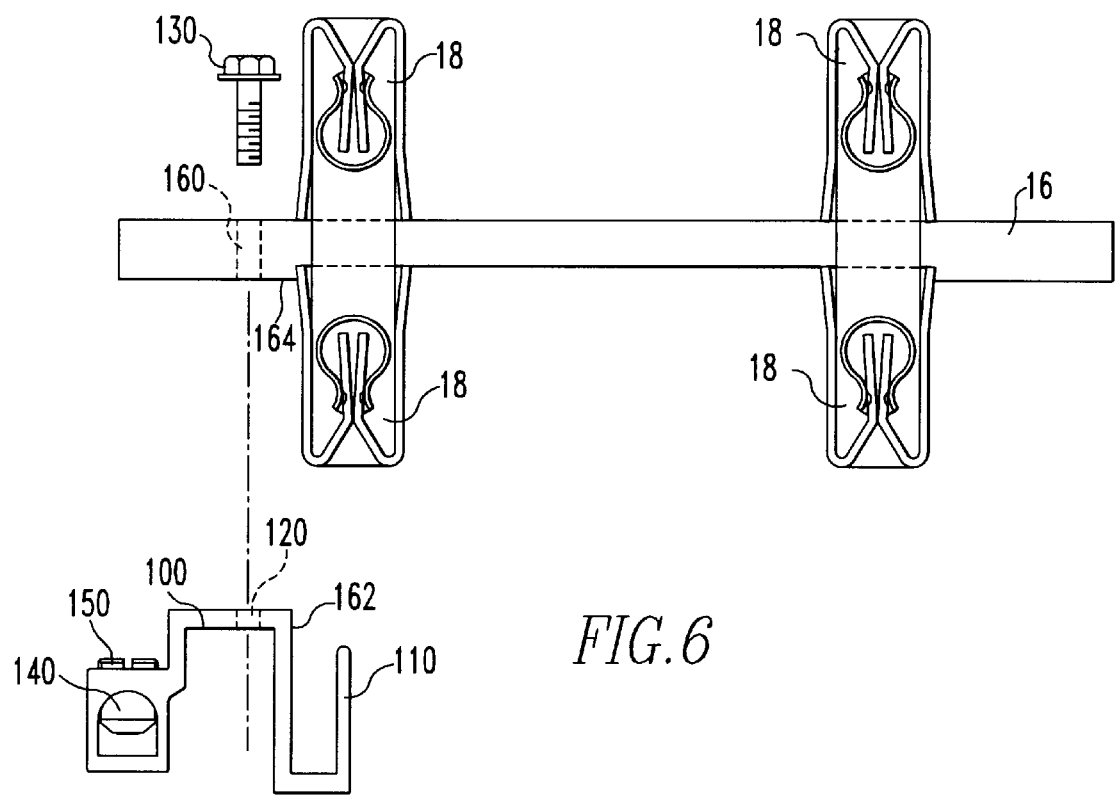
FIG. 6 is an exploded view, illustrating the assembly of the invention to the meter socket using an insulative fastener.
Figure 7:
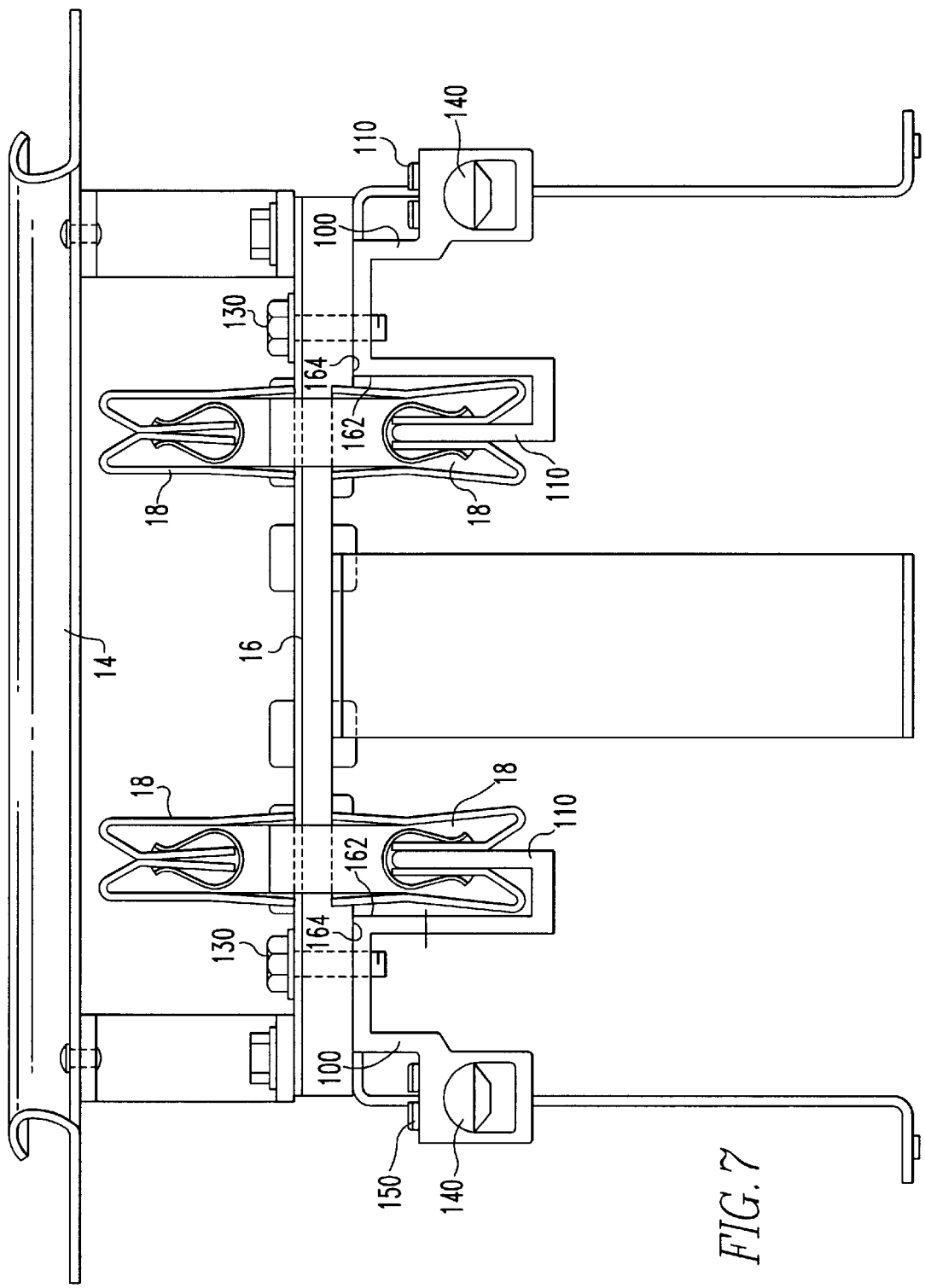
FIG. 7 is a bottom view of the assembly according to the present invention.

FIG. 6 shows an exploded view of the preferred lug 100, fastener 130 and meter socket 12 having double-ended fastenerless meter jaws 18. FIGS. 2 and 7 show front and bottom views, respectively, of the completed assembly of the preferred embodiment. FIG. 2 illustrates that the instant lug 100 can be used at both the supply and tenant engagement locations.

By providing one component that serves the functions of multiple prior art components, including support and electrical connectivity, the lug 100 of the instant invention greatly simplifies the construction of the meter socket assembly 12. Additionally, because the number of components is reduced, damage and/or failure leading to meter socket assembly 12 failure is minimized.

While a specific embodiment of the invention has been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the invention which is to be given the full breadth of the appended claims and any and all equivalents thereof.

What is claimed is:

1. An electrical watt-hour meter socket assembly, the meter assembly including at least two supply buses and two load buses, the buses having a substantially round configuration when viewed from one end, the electrical watt-hour meter socket assembly comprising:

a plurality of double ended fastenerless meter jaws disposed on said socket assembly; and an electrically conductive lug assembly having a stab, said stab being dimensioned and configured to be secured between said meter jaws, and defining a substantially round wire opening dimensioned and configured to receive one of said buses, said lug assembly being structured to form an electrical connection and a support between one of the buses and said meter jaws.

2. The assembly of claim 1, wherein said lug is constructed of aluminum.

3. The assembly of claim 1, wherein said lug has a vertical stab, said vertical stab being dimensioned and configured to engage at least one said fastenerless meter jaw at said bus engaging portion.

4. The watt-hour meter of claim 1, wherein said lug is coupled to said socket assembly using a fastener.

5. The watt-hour meter of claim 1 wherein said lug includes a wire opening, structured and configured to secure the wire within said loop.

6. The meter socket assembly according to claim 1, wherein the at least two supply buses and two load buses each have the form of a wire.

7. The meter socket assembly according to claim 1, wherein the lug includes a pair of ends, stab is at one end, and the wire opening is at the other end.

* * * * *